US011753551B2

(12) United States Patent
Richter et al.

(10) Patent No.: US 11,753,551 B2
(45) Date of Patent: Sep. 12, 2023

(54) STABLE ORGANIC LIGHT EMITTING COATING

(71) Applicants: YISSUM RESEARCH DEVELOPMENT COMPANY OF THE HEBREW UNIVERSITY OF JERUSALEM LTD, Jerusalem (IL); RAMOT AT TEL-AVIV UNIVERSITY LTD, Tel-Aviv (IL)

(72) Inventors: Shachar Richter, Mazkeret Batia (IL); Julia Gotta, Haifa (IL); Oded Shoseyov, Carmei Yosef (IL); Tal Ben Shalom, Beer Yaakov (IL)

(73) Assignee: Yissum Research Development Company of the Hebrew University of Jerusalem Ltd.

( * ) Notice: Subject to any disclaimer, the term of this patent is extended or adjusted under 35 U.S.C. 154(b) by 0 days.

(21) Appl. No.: 16/958,189

(22) PCT Filed: Jan. 2, 2019

(86) PCT No.: PCT/IL2019/050007
§ 371 (c)(1),
(2) Date: Jun. 26, 2020

(87) PCT Pub. No.: WO2019/135223
PCT Pub. Date: Jul. 11, 2019

(65) Prior Publication Data
US 2021/0071014 A1    Mar. 11, 2021

Related U.S. Application Data

(60) Provisional application No. 62/612,852, filed on Jan. 2, 2018.

(51) Int. Cl.
*C09D 5/22* (2006.01)
*C09D 7/65* (2018.01)
(Continued)

(52) U.S. Cl.
CPC .......... *C09D 5/22* (2013.01); *C09B 23/0075* (2013.01); *C09B 57/001* (2013.01); *C09D 7/65* (2018.01);
(Continued)

(58) Field of Classification Search
CPC .................. C09K 11/06; C09K 11/025; C09K 2211/1007; C09K 2211/1011;
(Continued)

(56) References Cited

U.S. PATENT DOCUMENTS 8,917,018 B2 * 12/2014 Belgorodsky ............ B05D 5/12
428/690
2011/0215716 A1   9/2011 Belgorodsky et al.

FOREIGN PATENT DOCUMENTS

WO     2013/132491     9/2013
WO     2014/201562     12/2014
(Continued)

OTHER PUBLICATIONS

Nudelman el al., Investigation of the pH-dependence of dye-doped protein-protein interactions. Protein Science. vol. 25, Sep. 6, 2016, pp. 1918-1923.*

(Continued)

*Primary Examiner* — C Melissa Koslow
(74) *Attorney, Agent, or Firm* — McAndrews, Held & Malloy, Ltd.

(57) ABSTRACT

The invention concerns a stable white light emitting diode (WLED) coating, composed of biological and organic materials and free of rare earth elements.

10 Claims, 5 Drawing Sheets

(51) Int. Cl.
| | |
|---|---|
| *C09B 23/01* | (2006.01) |
| *C09B 57/00* | (2006.01) |
| *C09D 101/02* | (2006.01) |
| *C09K 11/06* | (2006.01) |
| *H01L 33/50* | (2010.01) |
| *C09K 11/02* | (2006.01) |
| *H10K 50/125* | (2023.01) |

(52) U.S. Cl.
CPC .......... *C09D 101/02* (2013.01); *C09K 11/025* (2013.01); *C09K 11/06* (2013.01); *H01L 33/504* (2013.01); *H10K 50/125* (2023.02); *C09K 2211/1007* (2013.01); *C09K 2211/1011* (2013.01); *C09K 2211/1018* (2013.01)

(58) Field of Classification Search
CPC .......... C09K 2211/1018; H01L 33/504; H01L 51/5036; C09D 7/65; C09D 5/22; C09D 101/02
See application file for complete search history.

(56) References Cited

FOREIGN PATENT DOCUMENTS

| | | | |
|---|---|---|---|
| WO | WO 2016/174104 | * | 11/2016 |
| WO | 2017/079497 | | 5/2017 |

OTHER PUBLICATIONS

Hendler et al., Efficient Separation of Dyes by Mucin: Toward Bioinspired White-Luminescent Devices, Advanced Materials, 2011, vol. 23, pp. 4261-4264.

Nudelman et al., Investigation of the pH-dependence of dye-doped protein-protein interactions, Protein Science, 2016, vol. 25, pp. 1918-1923.

Hendler et al., Efficient Separation of Conjugated Polymers Using a Water Soluble Glycoprotein Matrix: From Fluorescence Materials to Light Emitting Devices, Macromolecular Bioscience, 2014, vol. 14, pp. 320-326.

Gotta et al., Stable White Light-Emitting Biocomposite Films, Advanced Functional Materials, vol. 28, No. 24, 9 pages.

* cited by examiner

STABLE ORGANIC LIGHT EMITTING COATING

CROSS-REFERENCE TO RELATED APPLICATIONS

The present application is a National Phase Entry of PCT International Application No. PCT/IL2019/050007 which was filed on Jan. 2, 2019, which claims priority to provisional patent application Ser. No. 62/612,852, filed Jan. 2, 2018, both of which are hereby incorporated by reference in their entireties.

TECHNOLOGICAL FIELD

The invention generally relates to stable organic light emitting coatings and uses thereof.

BACKGROUND

The operational principle of standard light emitting diode (LED) devices is based on electroluminescence from semiconductor p-n junctions: upon application of electric current to the device, recombination of electrons and holes takes place accompanied by emission of heat and/or of photons, in which the latter can produce light with characteristic wavelengths related to the difference between the conduction and the valence bands of the n and the p-type semiconductors. Since its invention at the end of the last century, and due to significant advances in LED technology (such as long lifetime, low power consumption, high reliability and environmental benefits), these devices have had a revolutionary impact on day-to-day life. They are used in a vast range of lighting applications, from the household to hand-held electronics to automotive and aviation. The global market which accounted for 26 billion US dollars in 2016 is expected to double by 2022.

White LEDs (WLED) have been of special interest since white light emission is the most used application of LEDs. As the generation of white light requires emission of a broadband part of the visible spectra, LEDs, being typically a resource for nearly monochromatic light, cannot be used directly for the task of white light generation. Instead, these require a combination of LEDs with the three primary colors (Red, R, Green, G, and Blue B) or complementary mixing (blue and yellow). The ratio between the white components gives different "levels" of white light which can be quantified by means of several standards.

There are two practical methods to generate WLEDs. The first is to assemble the three primary colors, RGB, in one device and operate them independently to give a white light emission. The second is to utilize blue- or ultraviolet (UV)-LED to excite a phosphor material by means of a photon-to-photon (the first being generated by the LED and the second from the phosphor material existing in the coating) energy conversion to give white light.

Currently, there is a limited number of phosphor materials that are suitable for this task. These compounds include mainly rare earth elements (REEs) such as Cerium, Europium, Gadolinium, Lanthanum, Terbium, and Yttrium. The REEs' unique electron configuration (sequential filling of f-orbitals) provides them with outstanding optical, luminescent, electronic and magnetic properties, thus they are also used in various consumer products, such as computers, cell phones, and televisions. Global demand for REEs has been increasing at an annual rate of 8-12%. However, there are many environmental issues as well as cost matters associated with the mining, isolation, recovery, and recycling of REEs. The development of a low-cost REE-free coating, which exhibits competitive performance to conventional WLED is therefore of great importance.

LED phosphor materials are incorporated into a polymeric "host" matrix. Though it is not the optically active component of the coating, the host matrix plays an important role in the LED performance Various polymeric materials, such as epoxies, epoxy/silicone hybrids, silicones or glasses may be used. Their fabrication processes, as well as their final performance, is largely influenced by environmental parameters such as humidity and temperature, which in turn affects both the final LED's performance and its fabrication cost. Because of these limitations, there is a continuous quest for alternative materials that might replace REEs. These include inorganic materials such as $Sb^{3+}$—, $Mn^{2+}$-doped calcium halophosphates, polymeric materials such as polyR9,9-dihexylfluorene)-co-alt-(9,9-dihexyl bis(6-azidoxexyl)fluorene)] (PFA), poly[(9,9-dihexylfluorene)-co-alt-(9,9-bis(6-bromohexyl)fluorene)] (PFB) and poly[9,9-dihexyl-9H-fluorene] (PF), as well as organic materials such as rhodamine B (RhB) and fluorescein isothiocyanate (FITC).

Currently, the common commercial WLED is made of a LED blue chip with $Ce^{3+}:Y_3Al_5O_{12}$ (Ce:YAG) yellow phosphor encapsulated in silicone/epoxy resin. This type of an organic polymer binder has poor thermal stability and ages under accumulated heat from the chip. Thus, its operation is limited with respect to high-power or short-wavelength excitation light sources.

An additional challenge in the fabrication of WLED coatings is its architecture. The realization of white light by mixture of the primary colors is possible only by stringent control over energy-transfer exciton diffusion between the components. This is because physically-closed dyes can produce non-radiative interactions upon excitation (such as Foerster resonance energy transfer), causing undesirable emission shift. Several solutions to this problem have been proposed including the doping of the phosphor materials into one emitting layer (matrix-filler materials) in a way that they are far enough separated from each other, or are, alternatively, held in separate layers.

In previous studies [1-3], a new paradigm was demonstrated, facing the current WLED fabrication challenges. It was suggested to exploit natures' ability to form many types of stable and controllable host-guest systems to reduce the unwanted non-radiative energy transfer mechanisms in dyes which are in close proximity. This was demonstrated by introducing dyes into oligosaccharides-proteins which effectively encapsulated them and reduced the FRET process significantly. This permitted successful construct of white protein-based luminescent films and devices that, however, did not show sound stability characteristics (in terms of heat, humidity, and UV resistance), due to their biological nature.

PUBLICATIONS

[1] N. Hendler, B. Belgorodsky, E. D. Mentovich, M. Gozin, S. Richter. *Adv Mater* 2011, 23:4261-4264.

[2] R. Nudelman, E. Gloukhikh, A. Rekun, S. Richter, *Protein Sci* 2016, 25, 1918.

[3] N. Hendler, J. Wildeman, E. Mentovich, T. Schnitzler, B. Belgorodsky, D. K. Prusty, D. Rimmerman, A. Herrmann, S. Richter. *Macromol Biosci* 2014, 14, 320.

[4] U.S. Pat. No. 8,917,018.

GENERAL DESCRIPTION

The inventors of the invention disclosed herein have developed a stable white light emitting diode (WLED) coating, wholly composed of biological and organic materials and absent of rare earth elements (REEs). The inventors utilize both encapsulation properties of proteins and superior characteristics of cellulose host matrix materials such as cellulose nanocrystals (CNCs). Despite of their biological nature, composites of the invention exhibit excellent optical and mechanical properties as well as resistance to heat, humidity and UV radiation.

Figure 1:
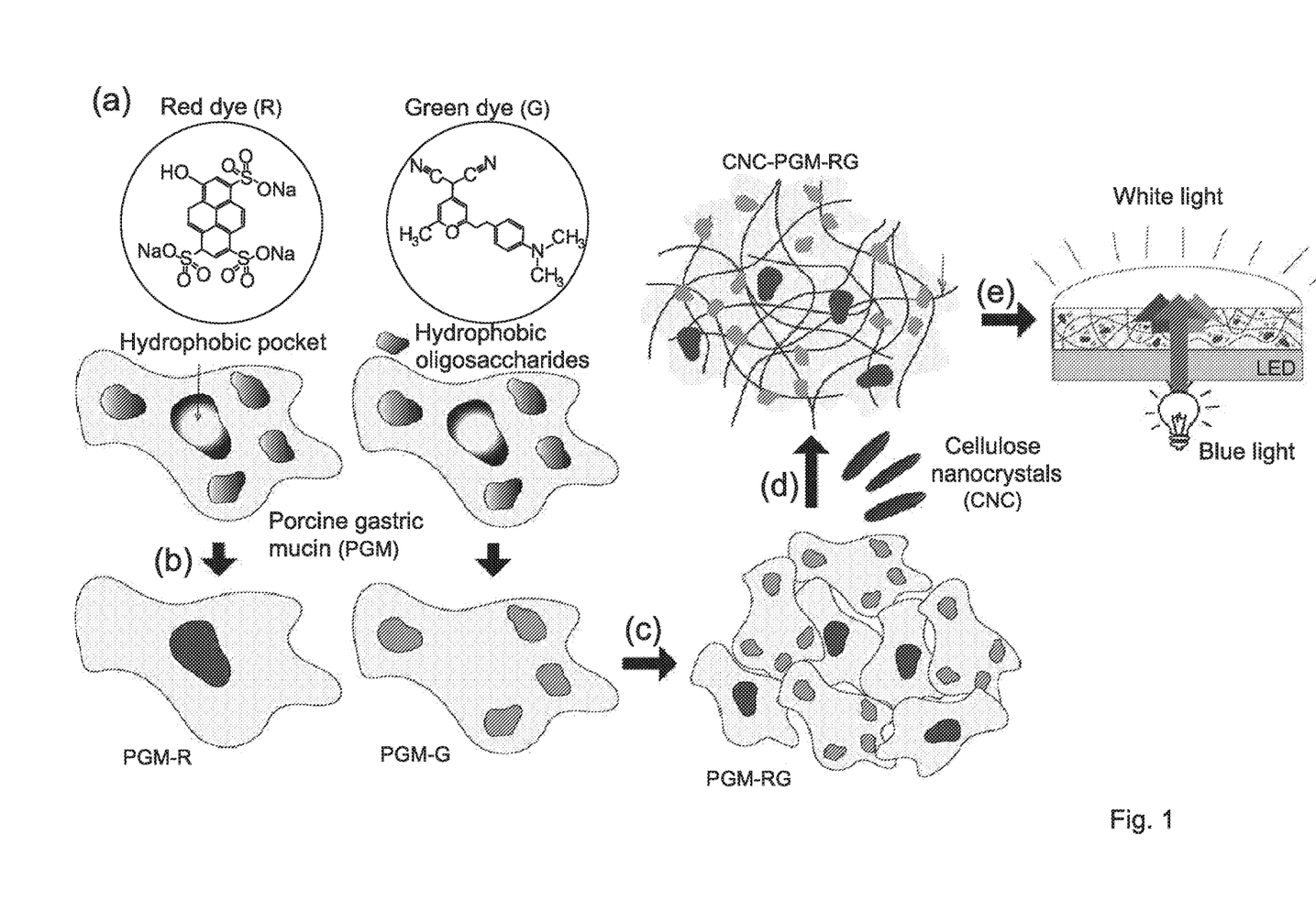

A complete WLED device is also provided that, according to some embodiments, is composed of a blue/UV LED chip and a REE-free coating. The concept of a film fabrication and operable as a coating for WLED is depicted in FIG. 1. As shown, in the first stage, two types of dyes (Red, R, and Green, G), which are chosen to be optically excited in the same wavelength range, are encapsulated within a highly glycosylated host protein mucin, such as PGM (Porcine Gastric Mucin). The PGM-encapsulated dyes (PGM-RG) are then incorporated within a transparent and protective matrix composed of cellulose nanocrystals (CNCs), yielding a light emitting CNC-PGM-RG composite. This light emitting CNC-PGM-RG composite is formed into a coat on a blue- or UV-LED. Once the latter is operated, white light in appearance is generated by means of wide emission spectrum composed of the LED wavelength and the optically excited R- and G-dyes.

The invention thus provides a reliable and stable white-light emitting diode (WLED) that is one of the main technological challenges of the LED industry today. While this challenge is usually accomplished by incorporating light-emitting rare-earth (REEs) materials within an external polymeric coating of a blue LED, the technology disclosed herein does not utilize rare earth elements and thus provides REE-free white LED coating that is fully composed of biological components (crystalline nano-cellulose and porcine gastric mucin) and acts as a matrix for carrying one or more light emitting dyes.

Thus, in its most general scope, the invention concerns a composition comprising crystalline nano-cellulose (CNC) and at least one mucin or transferrin. In some embodiments, the composition further comprises at least one organic material, such as at least one dye.

CNCs are highly crystalline nanoparticles that are generated during controlled acid hydrolysis of cellulose fibers resulting in the degradation of amorphous regions. CNCs exhibit rod-like shape with 100-400 nm length and 5-20 nm width and are considered super strong materials. CNCs may be present as chiral nematic liquid crystals in water or organic solvents and self-assemble to macroscale highly transparent ordered films with nanoscale thickness and a layered structure. The material can be produced from cell walls of trees, plants and waste effluents such as paper mills and municipal sewage sludge, and has recently become commercially available at the commercial scale. CNC may be prepared according to any one available procedure, for example according to procedures reported in WO 2012/014213, WO 2015/114630, and in US applications derived therefrom, each being herein incorporated by reference.

Mucins are proteins found in the mucous membranes of animals and humans. The primary role of these proteins is to protect gastrointestinal tract from hydrochloric acid, which is essential for food digestion, but harmful to epithelial cells. The mucins may be any mucin known in the art, including synthetic, semi-synthetic, natural mucins or commercially available mucins. In mucins, such as porcine gastric mucin (PGM), the monomeric form has a molecular weight of about 640 kDa, where the carbohydrates amount to about 80% of the total mass. O-linked glycans such as N-acetyl-galactosamine, N-acetylglucosamine, fucose, galactose and sialic acid (N-acetylneuraminic acid) are attached to the hydroxyl side chains of threonine and serine. Mucins are rich in cysteines, which form inter- and intra-molecular disulfide bonds resulting in oligomers and polymers of up to 40 MDa.

In some embodiments, the mucin is an animal- or a plant- or a microorganism-derived mucin (or mucilage). In some embodiments, the mucin is animal-derived mucin. In such cases, the mucin may be derived from any vertebrate animal species, including, fish, amphibians, reptiles, birds or mammals.

In some embodiments, the mucin is either plant-derived mucilage or microorganism-derived mucilage, or a mixture thereof.

In some embodiments, the mucin is a porcine gastric mucin (PGM).

In some embodiments, the mucin, e.g., PGM, may be replaced with transferrin, or at least one other protein having a hydrophobic void, or combinations thereof with mucin.

In compositions and products of the invention, the mucin, e.g., PGM, serves as a matrix for the organic components, e.g., dyes, allowing preservation of sufficient distance from each other to avoid undesirable effects. The organic components bind selectively to different domains in the protein. For example, organic hydrophilic compounds such as 8-hydroxypyrene-1,3,6-trisulfonic acid trisodium salt (G-dye, in the present case) bind to hydrophilic oligosaccharides in the peptide, while organic hydrophobic compounds such as 4-(dicyanomethylene)-2-methyl-6-(4-dimethylaminostyryl)-4H-pyran (R-dye) bind to polypeptide pockets in the main core protein. This allows full solubilization of the two types of organic materials, e.g., dyes, in the matrix material.

In other words, the protein, e.g., mucin, associates with the two dyes via different association regions that are sufficiently spaced-apart or distant from one another to avoid undesired interactions.

The at least one organic material may be selected from any such material, hydrophilic or hydrophobic or a combination of the two, which use in the formation of e.g., films, is desired. In some embodiments, the organic material is a dye material or a chromophore. Where two or more such dyes or chromophores are used in combination, they may be excitable at the same wavelength or at different wavelengths.

The dyes or chromophores used in accordance with the invention are light emitting dyes, comprising at least one chromophore functionality. Generally speaking, the dyes may be selected from cyanines, indoles, indophenol dyes, porphyrins, corroles, phthalocyanines, polycyclic aromatics, fluorenes, rhodamines, acridines, azin and oxazin dyes, triarylmethane dyes, azo dyes, quinones and others.

In some embodiments, the dyes may be selected amongst fluorescent polymers such as poly((4,4'-hexafluoroisopropylidene)diphthalic anhydride-alt-thionin), poly(2-naphthyl methacrylate), poly(3,3',4,4'-benzophenonetetracarboxylic dianhydride-alt-ethidium bromide), poly(9-anthracenylmethyl acrylate), poly(fluorescein O-acrylate), poly[(4,4'-hexafluoroisopropylidene)diphthalic anhydride-alt-acridine yellow G], poly[(methyl methacrylate)-co-(2-naphthyl acrylate)] and poly[N-(1-naphthyl)-N-phenylmethacrylamide].

In some embodiments, the dyes may be selected amongst metal complex dyes such as 8-hydroxyquinoline copper(II) salt, bis(2-methyl-8-hydroxyquinolinato)zinc, copper(II)

phthalocyanine, lithium tetra(2-methyl-8-hydroxyquinolinato)boron, tris(2,2'-bipyridyl)dichlororuthenium(II) hexahydrate, tris(benzoylacetonato) mono(phenanthroline)europium(III) and tris-(8-hydroxyquinoline)aluminum.

In some embodiments, the dyes may be selected amongst light emitting dyes such as 1,1,4,4-tetraphenyl-1,3-butadiene, 1-pyrenebutyric acid, 2-ethylanthraquinone, 3,8-diamino-6-phenylphenanthridine, 5,8-dihydroxy-1,4-naphthoquinone, 5-methoxypsoralen, 9,10-phenanthrenequinone, benzo[k]fluoranthene, phenanthrene, phenazine, pyrene, quinizarin, rubrene and p-terphenyl.

In other embodiments, the dyes may be selected amongst pathalocyanines such as 1,4,8,11,15,18,22,25-octabutoxy-29H,31H-phthalocyanine, 2,9,16,23-tetraphenoxy -29H, 31H-phthalocyanine, aluminum 1,4,8,11,15,18,22,25-octabutoxy-29H,31H-phthalocyanine triethylsiloxide, boron sub-2,3-naphthalocyanine chloride, cobalt(II) 2,3-naphthalocyanine, copper(II) 1,4,8,11,15,18,22,25-octabutoxy-29H, 31H-phthalocyanine, disodium phthalocyanine, gallium(III) phthalocyanine hydroxide, indium(III) phthalocyanine chloride, iron(II) phthalocyanine, lead(II) phthalocyanine, manganese(III) phthalocyanine chloride, nickel(II) 2,9,16,23-tetraphenoxy-29H,31H-phthalocyanine, silicon 2,3-naphthalocyanine dichloride, silver phthalocyanine, tetrakis (4-cumylphenoxy)phthalocyanine, tin(II) phthalocyanine, titanyl phthalocyanine, vanadyl 2,3-naphthalocyanine, zinc 2,3,9,10,16,17,23,24-octakis(octyloxy)-29H,31H-phthalocyanine, Zinc(II) tetranitrophthalocyanine.

In other embodiments, the dyes may be selected amongst porphyrines such as 2,3,7,8,12,13,17,18-octaethyl-21H, 23H-porphine cobalt(II), 2,3,7,8,12,13,17,18-octaethyl-21H,23H-porphine copper(II), 2,3,7,8,12,13,17,18-octaethyl-21H,23H-porphine iron(III) acetate, 2,3,7,8,12,13,17, 18-octaethyl-21H,23H-porphine manganese(III) chloride, 2,3,7,8,12,13,17,18-octaethyl-21H,23H-porphine nickel(II), 2,3,7,8,12,13,17,18-octaethyl-21H,23H-porphine palladium, 2,3,7,8,12,13,17,18-octaethyl-21H,23H-porphine ruthenium(II) carbonyl, 2,3,7,8,12,13,17,18-octaethyl-21H, 23H-porphine, 5,10,15,20-tetrakis(1-methyl-4-pyridinio) porphyrin tetra(p-toluenesulfonate), 5,10,15,20-tetrakis(4-methoxyphenyl)-21H,23H-porphine cobalt(II), 5,10,15,20-tetrakis(4-sulfonatophenyl)-21H,23H-porphine manganese (III) chloride, 5,10,15,20-tetrakis(pentafluorophenyl)-21H, 23H-porphine palladium(II), 5,10,15,20-tetrakis[4-(allyloxy)phenyl]-21H,23H-porphine, 5,10,15,20-tetraphenyl-21H,23H-porphine ruthenium(II) carbonyl, 5,10,15,20-tetraphenyl-21H,23H-porphine zinc, 5,10,15,20-tetra-p-tolyl-21H,23H-porphine, platinum octaethylporphyrin, protoporphyrin IX zinc(II).

In some embodiments, the dyes may be selected amongst hydrophilic dyes. In some embodiments, the hydrophobic dye is 8-hydroxypyrene-1,3,6-trisulfonic acid trisodium salt.

In some embodiments, the dyes may be selected amongst hydrophobic dyes, e.g., oligosaccharides, such as 4-(dicyanomethylene)-2-methyl-6-(4-dimethylaminostyryl) -4H-pyran.

In some embodiments, the composition comprises one dye. In other embodiments, the composition comprises two or more dyes.

In some embodiments, the organic material is selected from R-dyes, G-dyes, B-dyes and combinations thereof.

Thus, the invention further provides a composition (an optically active medium) comprising crystalline nano-cellulose (CNC), at least one mucin and at least one organic material, being a dye material, as defined herein.

The invention further provides a composite of crystalline nano-cellulose (CNC), at least one mucin (and/or transferrin) and at least one organic material, optionally a dye material. In some embodiments, the composite comprises one or more of R-dyes, G-dyes and B-dyes. In some embodiments, the composite is CNC-PGM-R, namely comprising CNC, PGM and R-dye, or in a similar fashion may be selected amongst CNC-PGM-R, CNC-PGM-G, CNC-PGM-B, CNC-PGM-RG, CNC-PGM-RB, CNC-PGM-GB or CNC-PGM-RGB. Any of the above composites may further comprise one or more additional organic or inorganic materials.

Any composition or composite according to the invention may be used to manufacture a material film on a surface region of a device or an article or an apparatus. The film, which may be of any thickness and shape, thus contains CNC, at least one mucin and an organic material, as defined.

The film may be in the form of a single layered blend of the materials, or may be in the form of a bi-layer comprising a layer of CNC and a layer of mucin with the organic material.

Films of the invention may be formed on any substrate material. Such materials may be carbonaceous materials, metallic materials (metals or materials comprising metals), oxides, glass, silicon-based materials, ceramic materials, polymeric materials (e.g. polycarbonate, BOPP, PET), hybrid materials, biomimetic material, biomaterials, dielectric crystalline or amorphous materials, fibers (e.g. cotton, glass fibers), paper, a combination of any of the listed materials (e.g. metallized PET, paperboards containing laminated plastic layers and pulp), and others.

The surface may be a surface region of a device or an apparatus which may be substantially flat or three-dimensional. The film may also be a multilayered structure comprising two or more films of the invention which may be optionally separated by one or more layer of a different material. In some embodiments, a multilayered structure according to the invention may comprise one or more layers, each of which comprising a blend of CNC, mucin and an organic material. In other embodiments, a multilayered structure according to the invention may comprise one or more bi-layers, each bi-layer comprises a layer of CNC and a layer of a blend of mucin and the organic material. In other embodiments, the multilayered film may be a hybrid film comprising at least one layer of blend of materials and at least one bi-layer, as defined.

In some embodiments, the film is formed on a blue or UV-LED. In such a case, the dyes selected in the composite of the invention may be R-dyes and G-dyes. Where the film is formed on a red or green LED, the composite may comprise a selection of B-dyes and G-dyes, or R-dyes and B-dyes, respectively; thereby yielding a white color in appearance.

The invention further provides a device comprising a film of a combination (composition or composite) according to the invention. The device, depending on its nature and intended application, may further comprise an electrode assembly (a cathode and an anode). The device may be in the form of a mono-layered or multilayered structure.

In some embodiments, the device is selected from a sensor, a light emitting diode, a solar cell, a photovoltaic cell, a light transducer and a tag.

In some embodiments, the device is a multicolored organic light emitting diode (OLED). The OLED may be a mono- or a multilayered OLED having, in some embodiments, a sandwich-like structure which includes a cathode (of a metal or a metal alloy, the metal being selected from aluminum, magnesium, titanium, gold and silver); a film according to the invention as an emitting layer(s); and an anode, made in some embodiments of indium-tin oxide (ITO) or another conducting inorganic oxide. The anode is in some embodiments covered or encapsulated with a protecting layer of glass or an insulating plastic. One or both of said anode and cathode may be transparent.

The invention further provides a white-emitting LED, the LED comprising a UV-LED (e.g., λ=380 nm) having on at least a region of its surface a composite according to the invention. The emitted white light is white in appearance to the naked eye.

In some embodiments, in the white emitting LED the composite is of 8-hydroxypyrene-1,3,6-trisulfonic acid trisodium salt and 4-(dicyanomethylene)-2-methyl -6-(4-dimethylaminostyryl)-4H-pyran, as disclosed herein.

The invention further provides a process for the preparation of a film according to the invention, the process comprising incorporating a product of association of mucin and the at least one organic material within a matrix composed of CNC. In some embodiments, the film is used for coating a surface, e.g., of a colored (R, or B, or G) LED, such as a blue- or UV-LED.

In some embodiments, the product of association of mucin and the at least one organic material is not a product in which covalent bonds are formed between the mucin and the organic material. Rather, the association may involve hydrogen bonding, electrostatic van der walls or any other non-covalent association. In some embodiments, the mucin encapsulates or rearranges around the at least one organic material.

In some embodiments, the product of association is obtained separately and in advance to the combination step with CNC.

In some embodiments, the product of association is a mixture of at least two such products: one being a product of association of mucin with one organic material (e.g., one dye) and the second being a product of association of mucin with another different organic material (e.g., a second dye). In some embodiments, each of the different products is pre-prepared and combined with another thereafter.

In some embodiments, the first product is PGM-R and the second (or another) is PGM-G. In some embodiments, a product of association to be combined with CNC is a combination of two products of association: PGM-R and PGM-G.

In some embodiments, the product of association is a product formed by contacting a blend of two or more organic materials with mucin.

In some embodiments, the ratio between the two organic materials is between 0.1:1 and 1:0.1. In some embodiments, the ratio is 1:1.

In some embodiments, the ratio between the organic material(s) and mucin is between 0.1:1 and 1:0.1. In some embodiments, the ratio is 1:1.

In some embodiments, the ratio between the product of association, as defined above, and CNC is 0.1:100, 0.1:10, 0.1:1, 1:100, 10:100, 1:1, 1:2, 1:3, 1:4, 1:5, 1:6, 1:7, 1:8, 1:9, 1:10, 1:11, 1:12, 1:13, 1:14 or 1:15 (product:CNC).

In some embodiments, a single mucin is associated with two different organic materials: a first dye material and with a second dye material.

The invention further provides a process for the preparation of a film according to the invention, the process comprising:
- contacting or interacting or mixing a product of association of mucin and at least one organic material with CNC to obtain a composite; and
- forming a film of the composite on a surface.

In some embodiments, the product of association is formed by combining mucin with at least one organic material, e.g., a dye, to obtain a product of association of mucin and the at least one organic material.

In some embodiments, the film is detached from the surface to obtain a self-standing film.

In some embodiments, the surface is of a blue- or UV-LED.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 1 depicts an exemplary fabrication process of highly-stable REE-free WLED coating according to the invention. In the fabrication process (a) a hydrophobic red dye e.g., 4-(dicyanomethylene)-2-methyl-6-(4-dimethylaminostyryl)-4H-pyran and a hydrophilic green dye e.g., 8-hydroxypyrene-1,3,6-trisulfonic acid trisodium salt are separately encapsulated within the porcine gastric mucin (PGM) structure, (b) the red dye is absorbed into the hydrophobic pocket of PGM, whereas the green dye is incorporated within the hydrophilic oligosaccharides. Thereafter, (c) the two complexes (PGM-R and PGM-G) are blended together to form a mixture (PGM-RG) that is then (d) incorporated within a matrix made of cellulose nanocrystals (CNC) forming a layered structure CNC-PGM-RG. (e) When the composite (CNC-PGM-RG) is coated onto a blue LED, white light is generated.

FIGS. 2C and 2D show tilted view—featuring the conformal coverage of the protein complex of CNC. FIGS. 2E-F are TEM images of the CNC-PGM-RG composites.

FIGS. 3A-D present fluorescence spectra of the (FIG. 3A) CNC-PGM-G-, (FIG. 3B) CNC-PGM-R- and (FIG. 3C) CNC-PGM-RG-films.

FIGS. 4A-C present a WLED device.

DETAILED DESCRIPTION OF EMBODIMENTS

Composite Characterization

A complete WLED device is also provided that is composed of a blue/UV LED chip and a REE-free coating. The concept of a film fabrication and operable as a coating for WLED is shown in FIG. 1, described hereinabove.

Optical and confocal images of a coating and of the free-standing film were obtained. It was evident that the films lose some of their transparency upon introduction of the PGM-bound dyes. While the addition of the hydrophobic R-dye substantially decreased transmittance, the hydrophilic G-dye only affected it slightly. The RG-film (white emission) exhibited average transmittance properties of these two (~40% transparency).

To evaluate the homogeneity of the composites, three-dimensional (3D) confocal microscopy images of the white film were taken. Each of the 3D images was composed of multiple two-dimensional layers taken at different depths, thus the overall picture was correlated to 3D distribution of the dyes. Images of the white film ($\lambda_{excitation}$=405 nm) and of the 3D spatial distribution of each of its RGB bands provided evidence that the guest material (PGM-dyes) was homogeneously distributed within the CNC host matrix. Morphological characterizations of the films were performed using scanning electron and transmission electron microscopy (SEM, TEM).

FIGS. 2A-D show top and tilted SEM micrographs of the films. The SEM results indicate that the PGM complex uniformly covers the fibrous network of the CNC host, further supporting the confocal microscopy observations. The TEM analysis also supports previous studies pointing towards the formation of a layered structure of the composites.

Figure 2A:
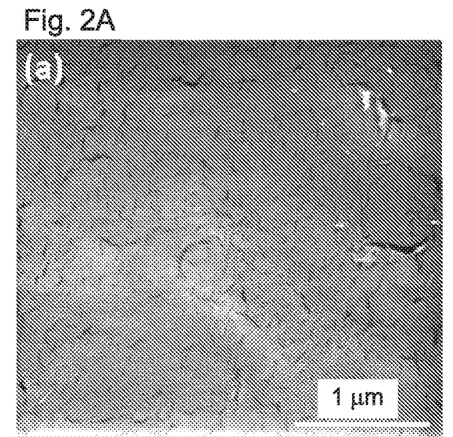
FIGS. 2A-F present SEM and TEM micrographs of the CNC-PGM-RG coating. SEM micrographs in FIG. 2A, FIG. 2B show top view
Figure 2B:
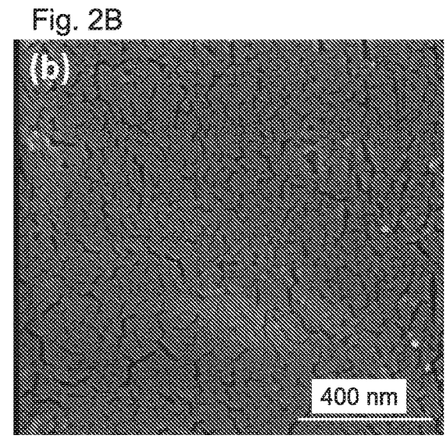
Figure 2C:
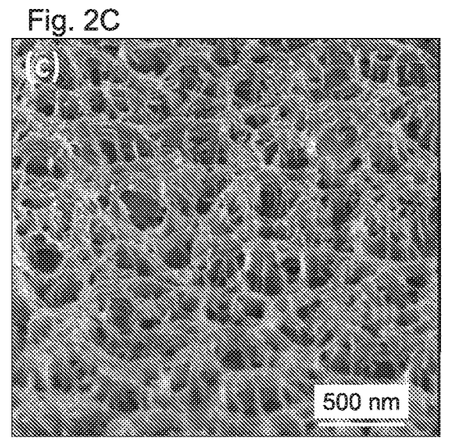
Figure 2D:
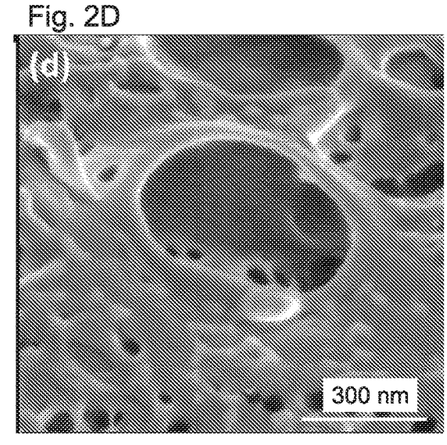
Figure 2E:
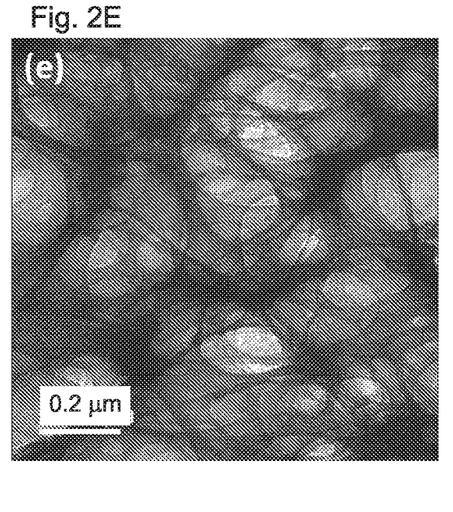
Figure 2F:
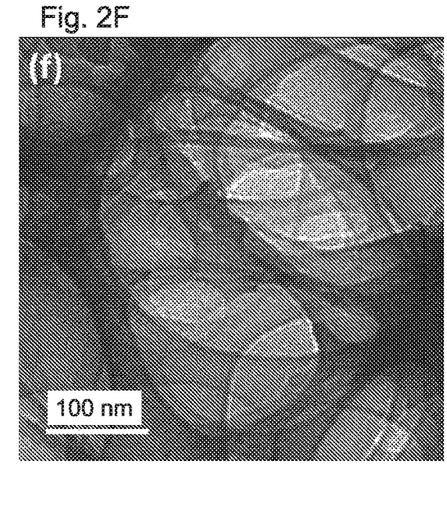
Figure 3A:
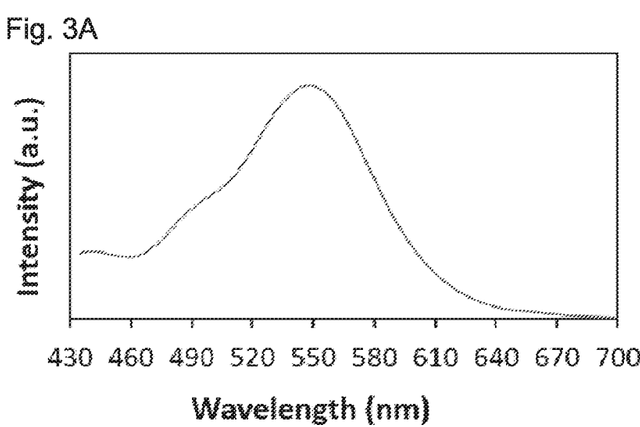
Figure 3B:
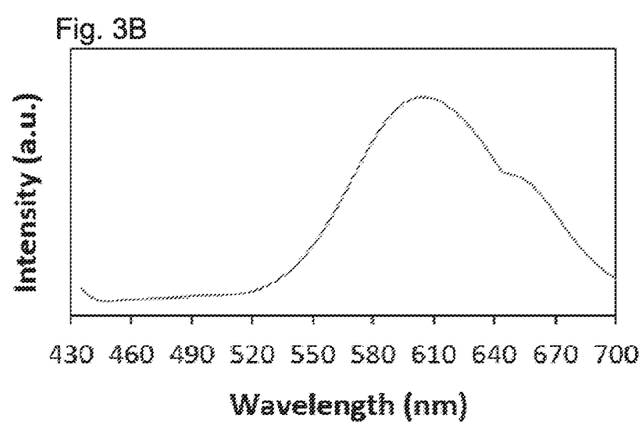
Figure 3C:
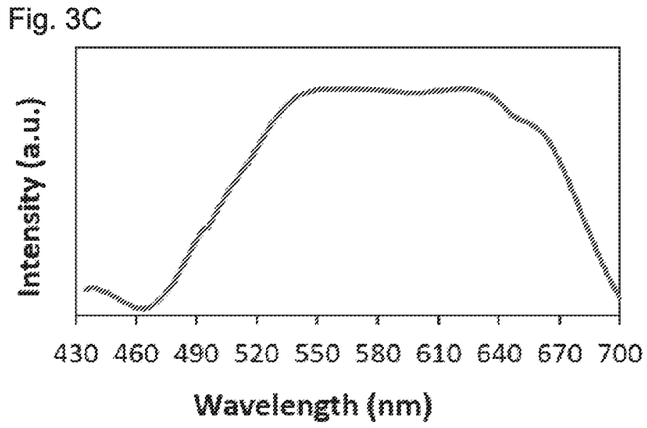
Figure 3D:
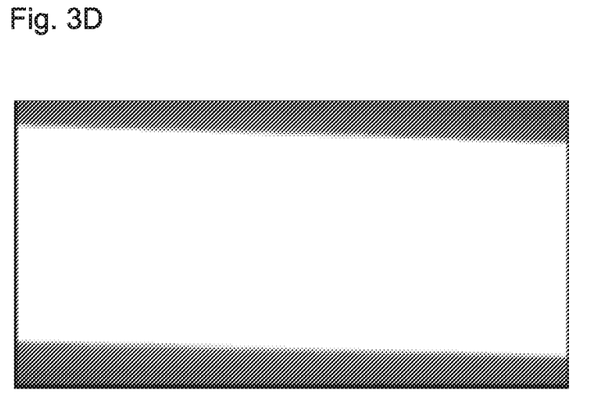
FIG. 3D provides an optical image of the UV-illuminated CNC-PGM-RG coating.

Additionally, results indicate that multiple layers with ellipsoid components of an average size of approximately 250 nm are formed in the CNC and the composite materials.

Next, the mechanical properties of the stand-alone films were evaluated. Qualitative bending test taken for the CNC-PGM-RG film, exhibits pronounced elastic properties. An optical investigation revealed that the bending action did not cause any deformation or cracks.

In most cases, the two-dye composite showed average characteristics of the G-based complex (highest tensile stress/strain and toughness) and the R-complexes (the lowest values).

Optical Properties

Fluorescence spectra ($\lambda_{excitation}$–420 nm) and a corresponding image of a white film are shown in FIG. 3. The fluorescence data (FIG. 3A-C) shows a relatively broad spectrum for the CNCPGM-R ($\lambda_{max}$=605 nm) and the CNC-PGM-G ($\lambda_{max}$=548 nm), indicating that each dye maintains its optical properties when incorporated in the host matrix. The emission spectra of the CNC-PGM-RG film ($\lambda_{max}$=562 nm and 625 nm) is shown in FIG. 3C. As expected, a continuous broadband spectrum was obtained, indicating the existence of a white-emitting coating. When the film was illuminated (FIG. 3D, $\lambda_{excitation}$=365 nm), uniform and bright white light was obtained from the film.

Figure 4A:
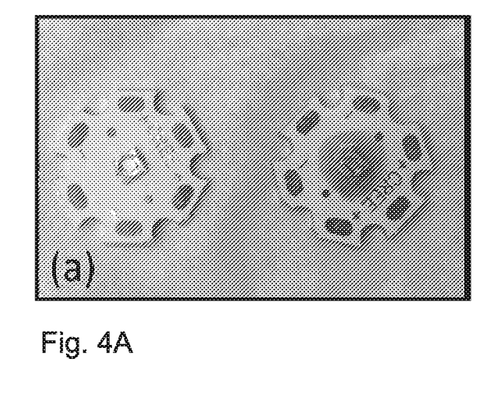
FIG. 4A provides a photograph of the original UV-purple LED (left) and after deposition of the CNC-PGM-RG coating (right).
Figure 4B:
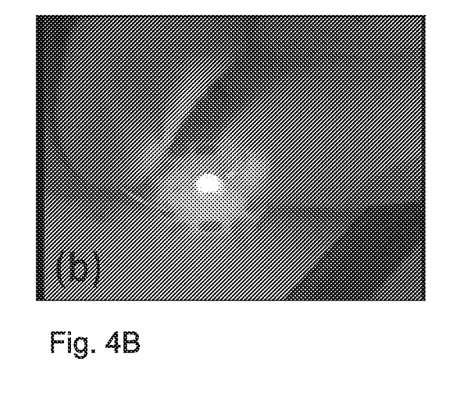
In FIG. 4B shown is the original purple light emitted from an operating UV-purple LED in comparison to FIG. 4C where the emission of white light is shown after being coated with the CNC-PGM-RG composite.
Figure 4C:
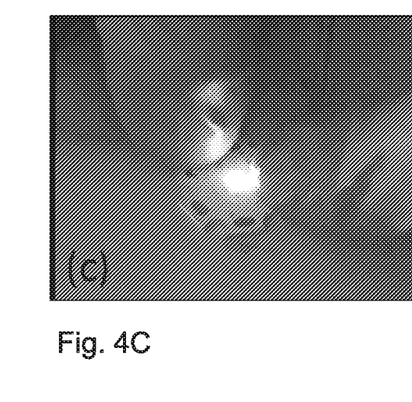

Further optical characterization of the light emitting coating revealed that the material exhibits a quantum yield of 38.1%, a color rendering index (CRI) of 84.4, and a correlated color temperature (CCT) ranging between 3543 K and 4150 K, which indicates the formation of a warm-white light LED (CCT<4500 K). To form a complete white-emitting solid LED, the composite was deposited on the surface of a commercial UV-LED ($\lambda$=380 nm), which was used as an excitation light source. FIG. 4 shows that the fabricated LED exhibits conformal and bright white light emission.

Stability Tests

Figure 5A:
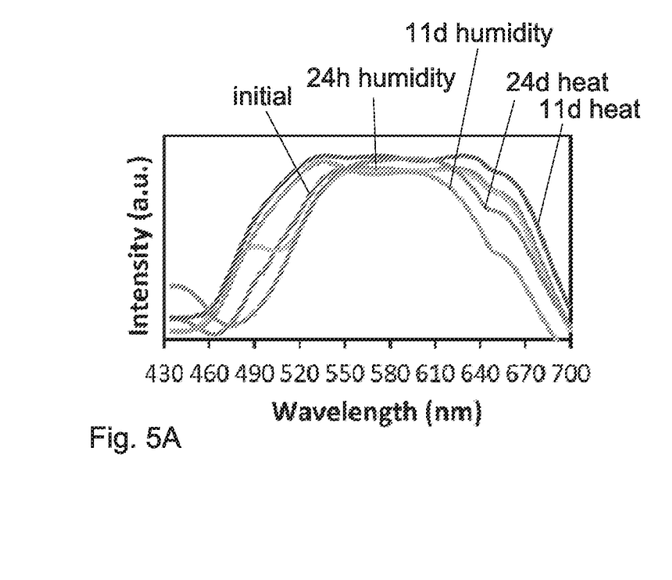
FIGS. 5A-B present fluorescence spectra under (FIG. 5A) humidity (90% RH), and heat conditions (85° C.) over time, and under (FIG. 5B) constant UV illumination.
Figure 5B:
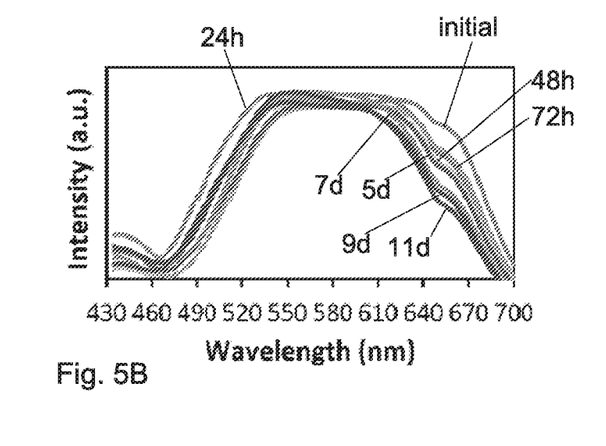
Figure 6A:
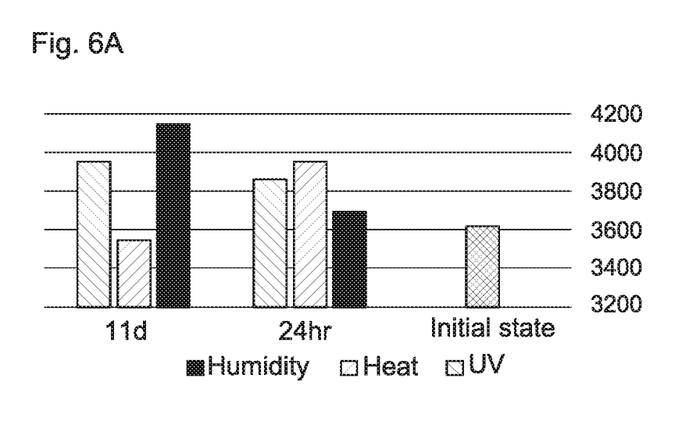
FIGS. 6A-C show the effect of an external stimuli on (FIG. 6A) the correlated color temperature (CCT), (FIG. 6B) the color rendering index (CRI) and (FIG. 6C) the CIE values.
Figure 6B:
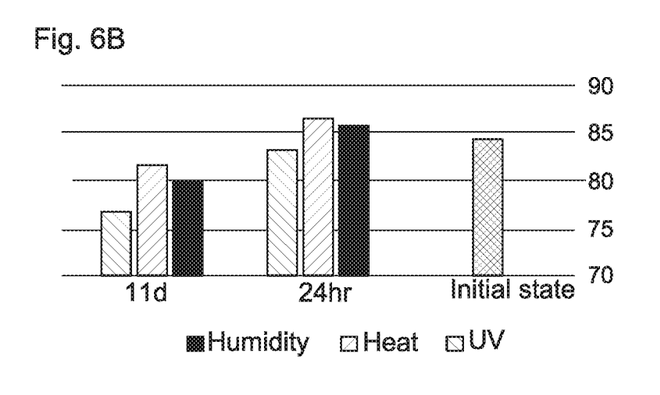
Figure 6C:
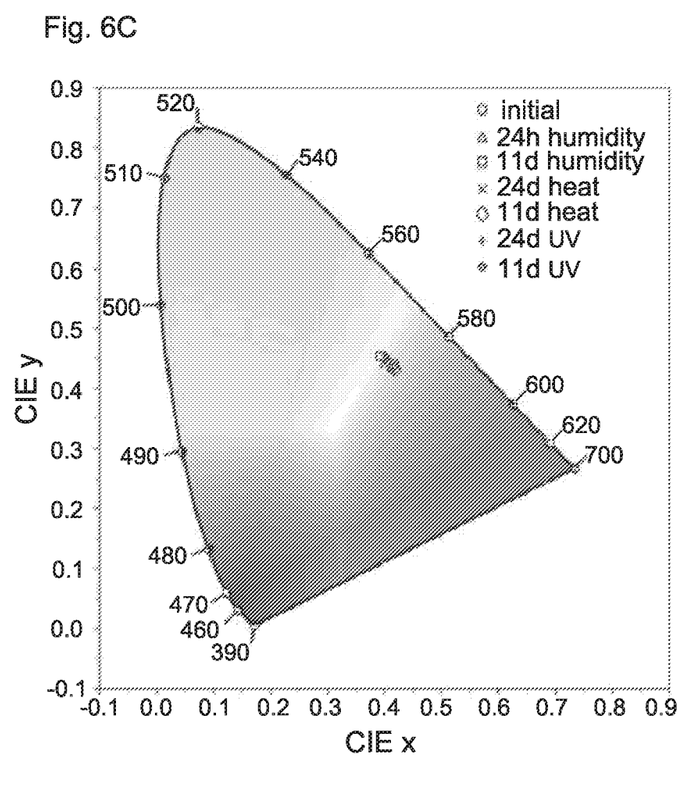

The effect of humidity, temperature, and UV on the luminescent properties of the CNC-PGMRG coating was investigated (FIGS. 5 and 6). All films were optically examined after the stability tests. No cracks or other defects were found and the coatings kept their transparency and exhibited white light emission under UV illumination. After a 24-hour exposure to relative humidity (RH) conditions of 90%, no significant change in the spectra was observed (FIG. 5A). However, after additional 10 d under the same conditions, some photobleaching was detected. This is manifested by a narrow- and a blue shift of the emission spectrum.

Heat stability tests clearly indicate that the CNC matrix efficiently protects the PGM-bound dyes. Interestingly, an unexpected increase of the fluorescence intensity was measured. This finding suggests the presence of heat-induced conformational changes of the PGMs' ternary structure, which in turn, result in a decrease in the efficiency of the unwanted UV absorption by the PGM. This leads to a subsequent increase in the dye emission efficiency.

Exposure of the complex to UV radiation ($\lambda$=365 nm) induces some decrease in the emission of the CNC-PGM-RG coating. It can be seen that with an increase in exposure time, the contribution of R to the spectra dye decreases.

Next, the effect of the external stimuli on the optical properties was studied. FIG. 6 shows the results of these test as calculated and measured by means of CRI, CCT, and CIE diagram (1931) chart. Although some decrease in the optical quality was observed (especially in the case of humidity), the light coordinates did not change significantly (yellow region), giving a good indication on the stability of the coating. Further investigation of the optical characteristics revealed that the quantum yield dropped only by 0.7% after heat treatment for 11 days, but a substantial drop of 13.7% was observed with respect to humidity.

Discussion

The invention disclosed herein provides (bio)composite for white light-emitting applications. It is evident that although the film is made of biological and organic materials it exhibits excellent optical and mechanical properties and found to be resilient to external stimuli. Few insights on the composite of the invention may be pointed out:

(i) The mechanical properties of the films, as well as its transparency, are affected by the chemical nature of the dyes and of the incorporation of the PGM. In general, except for some decrease in Young's modulus of the composite films compared with pristine CNC, ultimate strain ultimate stress and toughness were improved in the case of addition of the PGM-dyes. This can be explained by the plasticizing effect of the PGM-dyes. Similar effects have been shown in the case of CNC-Resilin composites. Notably, the incorporation of the PGM-G (hydrophilic) with the hydrophilic CNC allows the formation of strong interactions within the composite, which increase its mechanical properties. The film exhibits significant improvement in the average moduli and tensile stress and strain values at break, resulting in tougher films compared to CNC-PGM-R film. In the case of the CNC-PGM-R, hydrophilic-hydrophobic interactions take place which reduces the complex's mechanical behavior. In all cases, the addition of the PGM-R/G improved the mechanical properties of the films indicating strong interactions between the CNC and the PGM.

(ii) The composite was found to be relatively resilient to heat and UV, but less to humidity stimuli. Being a hydrophilic polymer, CNC can absorb water molecules, which might affect the hydrogen bonds composing the CNC network, leading to oxygen and water permeability. Water permeation through the composite can facilitate oxidation and photobleaching of the fluorescent organic dyes causing a decrease in their emission intensity and thus, decrease in internal quantum efficiency. Chemical modifications of the CNC preventing further oxygen penetration, as well replacement of the R dye by better anti-oxidant one might resolve this problem.

(iii) The CNC-PGM-RG coating showed high chromaticity stability. After exposure to UV, humidity and heat stimuli, CIE coordinates remained very close to initial state value.

The device of the invention is a REE-free bio-organic phosphor applicable for the use in WLED applications made out of CNC-PGM-RG biocomposite material. White color emission was observed when the complex was excited by UV/blue LED, and when implanted in a UV working LED. The coating was prepared by incorporation of PGM with embedded R- and G dyes into CNC. The coating revealed high thermal and UV stability, which play a crucial role in LED performance Nevertheless, the coating exhibits a reduced stability under high humidity conditions which requires further research into solving this issue.

Experimental Section

Composite preparation: G, 8-hydroxypyrene-1,3,6-trisulfonic acid trisodium salt (Sigma-Aldrich), and R, (4-(dicyanomethylene)-2-methyl-6-(4-dimethylaminostyryl)-4H-pyran), (Sigma-Aldrich) were introduced to a 20 mg/ml of PGM(Sigma-Aldrich) solution to prepare the following complexes:

Single color complexes: (1) G dye—4 mg, (2) R-3 mg, were added to 1 ml of PGM solution and stirred at 600 rpm for 72 hours. RG complexes: two single-color complex solutions (PGM-R and PGM-G) were mixed with ratio 1:1. The solution was then stirred at 600 rpm for 24 hours.

CNC suspension: A clear and transparent CNC suspension manufactured and kindly supplied by Melodea Ltd (% S=0.15, Z-Potential=−29±2), dialyzed for 5 days against distilled water. The CNC suspension was then sonicated (80% amplitude, 100% pulse time) for 5 minutes (500 V UIP1000hd industrial sonicator, Hielscher, Teltow, Germany).

CNC coating: PGM-RG complex solution were dispersed in CNC (2 wt. %) suspensions at ratio 1:12. The mixtures were vigorously stirred. 5 mL of CNC-PGM-RG suspensions were cast onto a glass substrate (7 cm×2.5 cm) in order to form 50 μm±10 μm thick layer.

Stand-alone film preparation: Stand-alone films. PGM-RG complex solution were dispersed in 13 ml CNC (2 wt. %) suspensions at ratio 1:12. The mixtures were vigorously stirred and cast onto a Sigmacote® treated glass substrate (7 cm×5 cm). The CNC/PGM-RG suspensions were dried for 48 h under ambient conditions. Finally, dried films were detached and cut with sharp scissors to the required form.

Confocal microscopy: Nikon A1₊confocal setup was used to scan the stand-alone film using 405 nm laser. For evaluation of the RGB bands contributions to the spectrum, Red (570-620 nm and 663-738 nm) Green (500-550 nm) and Blue (425-475 nm) filters were used.

SEM: Measurements were carried Out in Dual FIB-SEM (model FEI Helios Nanolab 600 Ion milling). The images were taken at top- and tilted. (52°)—views with an electron beam acceleration voltage of 1-2 kV and a current of 86 pA, while using a secondary electron detector. Prior to imaging, 14 nm of gold was sputtered on the samples to improve their conductivity.

TEM: Imaging was carried out using a computer-controlled TEM (JEM-2100F Jeol Pty Ltd.) fitted with a field emission gun. Samples were diluted in distilled water (×5) and deposited on a TEM grid (Gilder TEM Grids 600 mesh, Ted-Pella Inc.). Experiments were operated at 200 kV accelerating voltage and images were acquired with a Gatan UltraScan 1000 (2 k×2 k) CCD camera.

Mechanical tests: CNC-PGM-RG films were cut into rectangle 5 mm×20 mm stripes. The films' average thickness was obtained by measuring 4 random positions along the film using a Mitutoyo Digimatic Indicator (Type ID-S112 MB, Mitutoyo Manufacturing Co. Ltd).

The Caliber: Tensile properties of the films were determined by using an Instron 3345 universal testing machine equipped with a 100 N load cell, utilizing a cross-head speed of 2 mm/min, at 25° C. Five measurements were performed for each sample. The stress-strain curves were plotted and related parameters were calculated from the obtained results.

Optical properties: Fluorescence spectra were measured using a Fuorolog-322 spectrometer (Jobin Yvon). The measurements were done by excitation at 420 nm and emission was recorded over a spectral range of 435-700 nm (1 nm steps) with an integration time of 0.3 sec. Absolute PL quantum yield measurements were performed using an absolute quantum yield characterization system (Hamamatsu Quantaurus QY).

LED Fabrication: In order to obtain white LED, first, an epoxy layer of commercial UV LED was removed. Then the diode was coated with CNC-PGM-RG suspension by drop casting method. The coated device was operated by 3V battery.

CRI and CCT: CRI was calculated from the fluorescence spectra CCT of the phosphor was calculated by using the McCamy's approximation algorithm.

Stability Tests

Humidity: Samples were placed in a home-built humidity cell at 90% humidity for 24 hours. Then the samples were removed from the cell and examined. Afterwards, the samples were placed back for additional 10 days and then re-examined.

Heat: Samples were placed into the oven at 85° C. for 24 hours. Then the samples were removed from the oven and examined Afterwards, the samples were placed back for additional 10 days and then re-examined.

UV: UV lamp (Spectroline, ENF-260C/FE) was used. The samples were exposed to UV during 11 days (λ=365 nm) and were investigated every 24 hours. The emission spectra were obtained after every 24 hours exposure during first three days, then after 5,7,9 and 11 days.

The invention claimed is:

1. An optically excitable film comprising an optically excitable composition being a composite comprising crystalline nano-cellulose (CNC), at least one mucin and at least one organic dye selected from R-dyes, G-dyes and B-dyes, wherein the film is formed on a substrate material, the substrate being of a material selected from carbonaceous materials, metallic materials, oxides, glass, silicon-based materials, ceramic materials, polymeric materials, hybrid materials, biomimetic material, biomaterials, dielectric crystalline or amorphous materials, fibers, paper and any combination thereof.

2. The film according to claim 1, wherein the at least one mucin is PGM and the composite is in a form selected from CNC-PGM-R, CNC-PGM-G, CNC-PGM-B, CNC-PGM-RG, CNC-PGM-RB, CNC-PGM-GB and CNC-PGM-RGB.

3. A device comprising an optically excitable film comprising an optically excitable composite comprising crystalline nano-cellulose (CNC), at least one mucin and at least one organic dye selected from R-dyes, G-dyes and B-dyes, wherein the device is a multicolored organic light emitting diode (OLED).

4. The device according to claim 3, wherein the at least one mucin is PGM and the composite is in a form selected from CNC-PGM-R, CNC-PGM-G, CNC-PGM-B, CNC-PGM-RG, CNC-PGM-RB, CNC-PGM-GB and CNC-PGM-RGB.

5. A white-emitting LED, the LED comprising a UV-LED having on at least a region of its surface a film of an optically excitable film comprising an optically excitable composite comprising crystalline nano-cellulose (CNC), at least one mucin and at least one organic dye selected from R-dyes, G-dyes and B-dyes.

6. The LED according to claim 5, wherein the film comprises the G-dye 8-hydroxypyrene-1,3,6- trisulfonic acid trisodium salt and the R-dye 4-(dicyanomethylene)-2-methyl-6-(4-dimethylaminostyryl)-4H-pyran.

7. The LED according to claim 5, wherein the at least one mucin is PGM and the composite is in a form selected from CNC-PGM-R, CNC-PGM-G, CNC-PGM-B, CNC-PGM-RG, CNC-PGM-RB, CNC-PGM-GB and CNC-PGM-RGB.

8. A process for the preparation of a film according to claim 1, the process comprising incorporating a product of association of mucin and the at least one organic dye within a matrix composed of CNC to form a composite; and forming a film of the composite on a surface.

9. The process according to claim 8, wherein the product of association of mucin and the at least one organic dye is obtained separately and in advance to the combination step with CNC.

10. The process according to claim 8, wherein the product of association is a mixture of at least two products of association, wherein the first product is PGM-R and the second is PGM-G; or wherein the product of association to be combined with CNC is a combination of PGM-R and PGM-G.

* * * * *